US012684679B2

(12) United States Patent
Lu et al.

(10) Patent No.: US 12,684,679 B2
(45) Date of Patent: Jul. 14, 2026

(54) SEMICONDUCTOR SYSTEM INSPECTION TOOL AND METHODS OF OPERATION

(71) Applicant: Taiwan Semiconductor Manufacturing Company, Ltd., Hsinchu (TW)

(72) Inventors: Jou-Hsuan Lu, New Taipei City (TW); Chiao-Hua Cheng, Tainan City (TW); Cheng-Hsuan Wu, New Taipei City (TW); Ko-Ching Hou, Taipei City (TW); Jyun-Yan Chuang, Hsinchu City (TW); Cheng-Hao Lai, Taichung City (TW); Yu-Kuang Sun, Hsinchu City (TW); Sheng-Kang Yu, Hsinchu City (TW); Shang-Chieh Chien, New Taipei City (TW); Li-Jui Chen, Hsinchu City (TW); Heng-Hsin Liu, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 940 days.

(21) Appl. No.: 17/658,760

(22) Filed: Apr. 11, 2022

(65) Prior Publication Data

US 2022/0408538 A1      Dec. 22, 2022

Related U.S. Application Data

(60) Provisional application No. 63/202,613, filed on Jun. 17, 2021.

(51) Int. Cl.
*H05G 2/00* (2006.01)
*G03F 7/00* (2006.01)

(52) U.S. Cl.
CPC ....... *H05G 2/0086* (2024.08); *G03F 7/70033* (2013.01); *G03F 7/70166* (2013.01); *G03F 7/70925* (2013.01)

(58) Field of Classification Search
CPC ...... H05G 2/005; H05G 2/008; H05G 2/0086; G03F 7/70033; G03F 7/70166; G03F 7/70925; G03F 7/7085; G03F 7/70975; G01N 21/954
See application file for complete search history.

(56) References Cited

U.S. PATENT DOCUMENTS

| | | | | |
|---|---|---|---|---|
| 10,578,565 | B2 * | 3/2020 | Safai | ....................... G01N 23/18 |
| 2011/0319820 | A1 * | 12/2011 | Teoh | ................. A61M 25/0606 |
| | | | | 604/122 |

FOREIGN PATENT DOCUMENTS

| | | | | | |
|---|---|---|---|---|---|
| TW | 202006346 | A | * | 2/2020 | ............... G03F 1/84 |
| TW | 202147020 | A | * | 12/2021 | ............... G03F 1/22 |
| WO | WO-2012076216 | A1 | * | 6/2012 | ............. G01N 21/94 |

* cited by examiner

*Primary Examiner* — Robert H Kim
(74) *Attorney, Agent, or Firm* — Harrity & Harrity, LLP

(57) ABSTRACT

Some implementations described herein provide techniques and apparatuses for inspecting interior surfaces of a vessel of a radiation source for an accumulation of a target material. An inspection tool, including a laser-scanning system and a motor system supported by an elongated supported member, may be inserted into the vessel to generate an accurate three-dimensional profile of the interior surfaces. Use of the inspection tool is efficient, with short setup and scan times that substantially reduce a duration associated with evaluating the interior surfaces of the vessel for the accumulation.

20 Claims, 15 Drawing Sheets

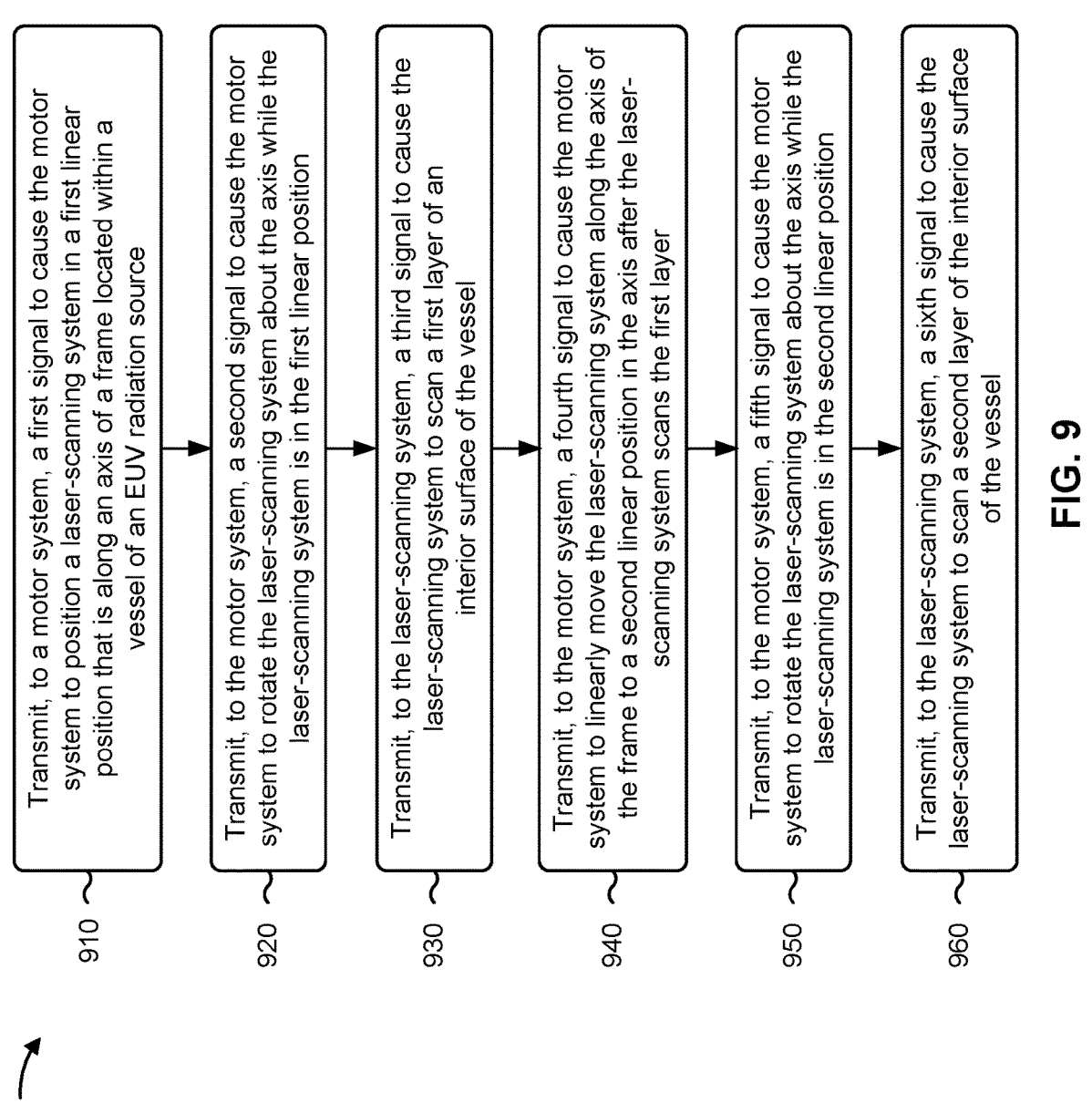

900

910 Transmit, to a motor system, a first signal to cause the motor system to position a laser-scanning system in a first linear position that is along an axis of a frame located within a vessel of an EUV radiation source 920 Transmit, to the motor system, a second signal to cause the motor system to rotate the laser-scanning system about the axis while the laser-scanning system is in the first linear position 930 Transmit, to the laser-scanning system, a third signal to cause the laser-scanning system to scan a first layer of an interior surface of the vessel 940 Transmit, to the motor system, a fourth signal to cause the motor system to linearly move the laser-scanning system along the axis of the frame to a second linear position in the axis after the laser-scanning system scans the first layer 950 Transmit, to the motor system, a fifth signal to cause the motor system to rotate the laser-scanning system about the axis while the laser-scanning system is in the second linear position 960 Transmit, to the laser-scanning system, a sixth signal to cause the laser-scanning system to scan a second layer of the interior surface of the vessel

FIG. 9

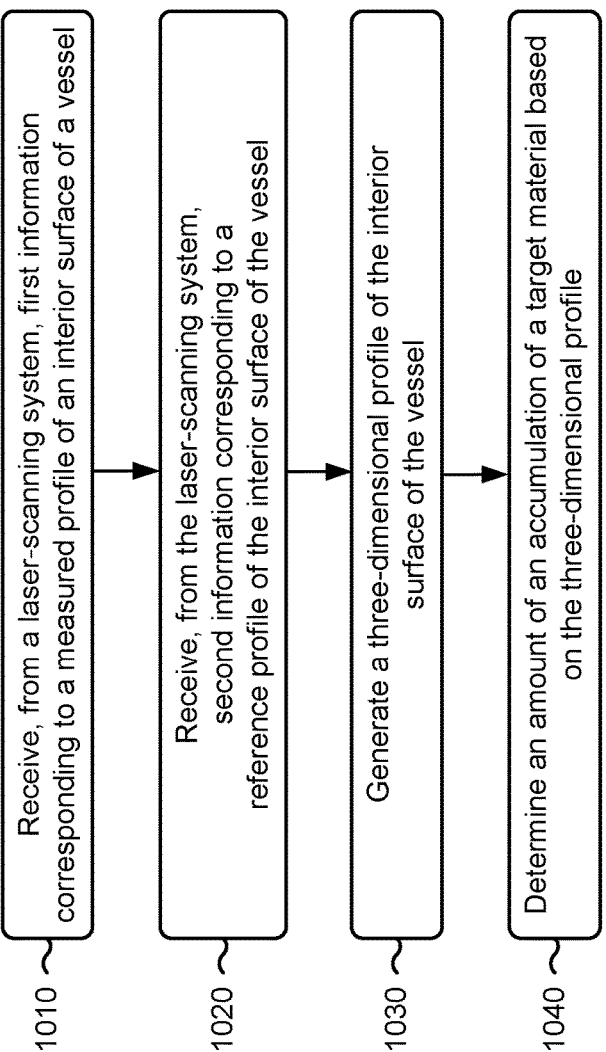

1010 — Receive, from a laser-scanning system, first information corresponding to a measured profile of an interior surface of a vessel 1020 — Receive, from the laser-scanning system, second information corresponding to a reference profile of the interior surface of the vessel 1030 — Generate a three-dimensional profile of the interior surface of the vessel 1040 — Determine an amount of an accumulation of a target material based on the three-dimensional profile

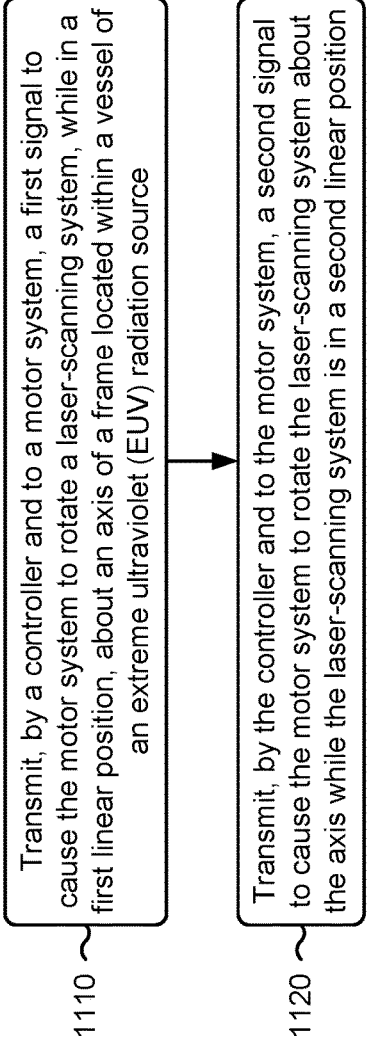

1110 — Transmit, by a controller and to a motor system, a first signal to cause the motor system to rotate a laser-scanning system, while in a first linear position, about an axis of a frame located within a vessel of an extreme ultraviolet (EUV) radiation source 1120 — Transmit, by the controller and to the motor system, a second signal to cause the motor system to rotate the laser-scanning system about the axis while the laser-scanning system is in a second linear position

1100

FIG. 11

SEMICONDUCTOR SYSTEM INSPECTION TOOL AND METHODS OF OPERATION

CROSS-REFERENCE TO RELATED APPLICATION

This Patent Applications claims priority to U.S. Provisional Patent Application No. 63/202,613 filed on Jun. 17, 2021, and entitled "Semiconductor Processing Tool and Methods of Operation." The disclosure of the prior Applications is considered part of and is incorporated by reference into this Patent Applications.

BACKGROUND

An extreme ultraviolet (EUV) radiation source includes a collector, which includes a curved mirror that is configured to collect EUV radiation and to focus the EUV radiation toward an intermediate focus near an intermediate focus cap (IF cap) of the EUV radiation source. The EUV radiation is produced from a laser produced plasma (LPP) that is generated by exposing droplets of tin (Sn) to a $CO_2$ laser. The Sn droplets are generated by a droplet generator (DG) head, which provides the Sn droplets into a vessel to an irradiation site where the Sn droplets are irradiated by a focused laser beam.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9-11 are flowcharts of example processes relating to inspection of a vessel described herein.

DETAILED DESCRIPTION

Figure 1:
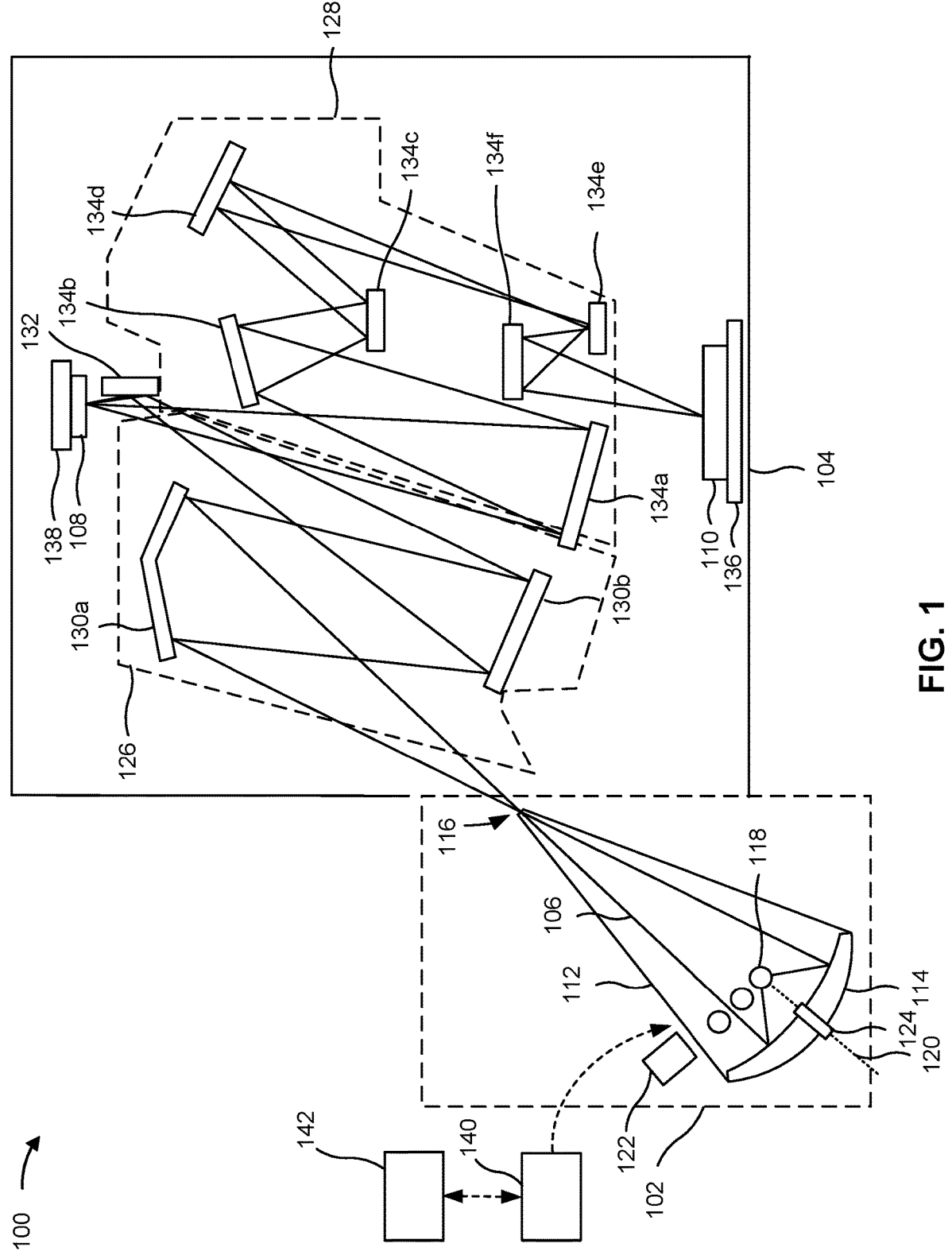
FIG. 1 is a diagram of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A lithography system, such as an extreme ultraviolet (EUV) lithography system, may include an EUV radiation source that includes a vessel. In the vessel, droplets of a target material are subjected to a beam of energy (e.g., light from a laser), which causes the formation of a plasma. The plasma releases energy in the form of EUV light, which is used to pattern photoresist layers on semiconductor substrates as part of semiconductor device fabrication. Target material accumulation (e.g., build-ups, clogging) can reduce the performance of the EUV radiation source, which may reduce the useful lifespan of the EUV radiation source, may result in the EUV radiation source having to be taken offline (which may impact manufacturing yield), and/or may result in an increase in defective wafers and waste, among other examples.

Some implementations described herein provide an inspection tool for inspecting a vessel of a radiation source (e.g., an EUV radiation source). The inspection tool includes a laser-scanning system supported by a frame that is at least partially inserted into the vessel. A motor system adjusts one or more positions of the laser-scanning system along one or more paths relative to the frame for the laser-scanning system to generate scans of an interior surface of the vessel. The laser-scanning system is capable of generating the scans under a variety of lighting conditions within the vessel, including low-light conditions and highly-reflective conditions. The scans can be used to generate an accurate three-dimensional profile of the interior surface and can be used to accurately determine an amount of an accumulation of target material on the interior surfaces. In addition to inspecting an intermediate focus (IF) cap portion of the vessel, the inspection tool can inspect the entire vessel, including a lower cone portion of the vessel, a scrubber portion of the vessel, and/or a vanes portion of the vessel. Use of the inspection tool is efficient, with a short set-up time (e.g., less than approximately 30 minutes) and short scan times (e.g., a time duration in a range from approximately 5 seconds to approximately 30 seconds for a layer, or portion, within vessel, or another time duration). Furthermore, scan information collected by the inspection tool described herein can substantially reduce target material accumulation evaluation times (e.g., by up to one hour or more). In this way, the inspection tool described herein may decrease downtime of a lithography system including the vessel and may increase productivity and throughput of the lithography system.

FIG. 1 is a diagram of an example lithography system 100 described herein. The lithography system 100 includes an extreme ultraviolet (EUV) lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 of a target material (e.g., droplets of a target material including Sn droplets or another type of droplets) of a target material being exposed to a laser beam 120. The droplets 118 are provided across the front of the collector 114 by a droplet generator (DG) head 122. The DG head 122 is pressurized to provide a fine and controlled output of the droplets 118.

A laser source, such as a pulse carbon dioxide (CO2) laser, generates the laser beam 120. The laser beam 120 is provided (e.g., by a beam delivery system to a focus lens) such that the laser beam 120 is focused through a window 124 of the collector 114. The laser beam 120 is focused onto the droplets 118 which generates the plasma. The plasma produces a plasma emission, some of which is the radiation 106. The laser beam 120 is pulsed at a timing that is synchronized with the flow of the droplets 118 from the DG head 122.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors include, for example, a mirror 130a and a mirror 130b. The mirror 130a includes a field facet mirror (FFM) or another type of mirror that includes a plurality of field facets. The mirror 130b includes a pupil facet mirror (PFM) or another type of mirror that also includes a plurality of pupil facets. The facets of the mirrors 130a and 130b are arranged to focus, polarize, and/or otherwise tune the radiation 106 from the radiation source 102 to increase the uniformity of the radiation 106 and/or to increase particular types of radiation components (e.g., transverse electric (1E) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors include, for example, mirrors 134a-134f. In some implementations, the mirrors 134a-134f are configured to focus or reduce the radiation 106 into an exposure field, which may include one or more die areas on the semiconductor substrate 110.

The exposure tool 104 includes a substrate stage 136 (e.g., a wafer stage) configured to support the semiconductor substrate 110. Moreover, the substrate stage 136 is configured to move (or step) the semiconductor substrate 110 through a plurality of exposure fields as the radiation 106 transfers the pattern from the reticle 108 onto the semiconductor substrate 110. The exposure tool 104 also includes a reticle stage 138 that configured to support and/or secure the reticle 108. Moreover, the reticle stage 138 is configured to move or slide the reticle through the radiation 106 such that the reticle 108 is scanned by the radiation 106. In this way, a pattern that is larger than the field or beam of the radiation 106 may be transferred to the semiconductor substrate 110.

In an example exposure operation (e.g., an EUV exposure operation), the DG head 122 provides the stream of the droplets 118 across the front of the collector 114. The laser beam 120 contacts the droplets 118, which causes a plasma to be generated. The plasma emits or produces the radiation 106 (e.g., EUV light). The radiation 106 is collected by the collector 114 and directed out of the vessel 112 and into the exposure tool 104 toward the mirror 130a of the illuminator 126. The mirror 130a reflects the radiation 106 onto the mirror 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 106 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

Under certain conditions, particles of a target material (e.g., corresponding to the droplets 118) may accumulate on one or more interior surfaces of the vessel 112. For example, hydrogen (H) radicals in the vessel 112 may combine with Sn to form stannane ($SnH_4$). If a temperature within the vessel 112 is greater than a temperature corresponding to a stannane dissociation temperature (e.g., greater than approximately 150° C.), the $SnH_4$ may dissociate into constituents including Sn and $2H_2$.

The target material (e.g., dissociated Sn) may accumulate on one or more interior surfaces of the vessel 112. The accumulation of the target material on the one or more interior surfaces of the vessel 112 may, in some instances, cause contamination within the radiation source 102 and/or within the exposure tool 104. For example, a build-up of target material can drip onto the collector 114, which may reduce performance (e.g., reflectivity) of the collector 114. As another example, a build-up of the target material on the one or more interior surfaces of the vessel 112 may cause particles of the target material build-up (e.g., Sn particles) to be ejected from the radiation source 102 into the exposure tool 104 (referred to as tin (Sn) spitting) and onto the reticle 108 and/or one or more mirrors in the exposure tool 104, reducing yield of semiconductor products fabricated using the lithography system 100.

In some instances, and as part of maintaining the lithography system 100, one or more interior surfaces of the vessel 112 may be inspected for accumulation of the target material, such as an interior surface of an intermediate focus (IF) cap portion of the vessel 112, a lower cone portion of the vessel 112, a scrubber portion of the vessel 112, or a vanes portion of the vessel 112. An inspection tool 140 may be inserted into the vessel 112 to inspect the interior surfaces of the vessel for an amount of an accumulation of the target material.

One or more hardware components may be mounted to a frame of the inspection tool 140, such as a laser-scanning system and/or a motor system. The inspection tool 140 may be communicatively connected with a controller 142. The controller 142 (e.g., a processor, a combination of a processor and memory, among other examples) may communicate with the inspection tool 140 to cause the motor system to change positions of the laser-scanning system and to cause the laser-scanning system to perform scans of the interior surfaces. Although illustrated as separate from the inspection tool 140 in FIG. 1, in some implementations, the controller 142 is part of (e.g., integrated in and/or mounted to) the inspection tool 140. Similarly, although illustrated as separate from the radiation source 102 in FIG. 1, in some implementations, the controller 142 is part of the radiation source 102.

As indicated above, FIG. 1 is provided as an example. Other examples may differ from what is described with regard to FIG. 1. For example, another example may include additional components, fewer components, different components, or differently arranged components than those shown in FIG. 1. Additionally, or alternatively, a set of components (e.g., one or more components) of FIG. 1 may perform one or more functions described herein as being performed by another set of components.

Figure 2:
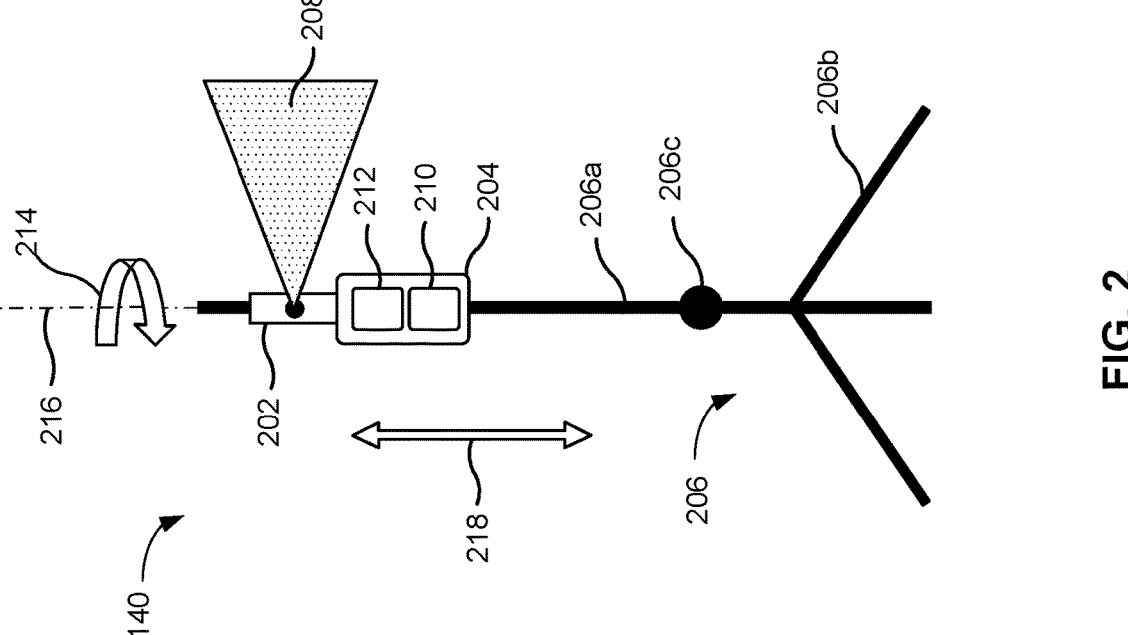
FIG. 2 is a diagram of an example implementation of an inspection tool described herein.

FIG. 2 is a diagram of an example implementation 200 of the inspection tool 140 described herein. As shown in FIG. 2, components of the inspection tool 140 include a laser-scanning system 202 and a motor system 204, and a frame 206. The frame 206 includes an elongated support member 206a and a base 206b. The laser-scanning system 202 is supported by the elongated support member 206a. In some implementations, and as shown in FIG. 2, the laser-scanning system 202 is mechanically coupled to the motor system 204, which attaches to the elongated support member 206a. In some implementations, the frame 206 also includes an alignment component 206c (e.g., a hinge, a clamp, a gimble, among other examples) that may change an orientation of the elongated support member 206a with respect to the base 206b.

The laser-scanning system 202 generates a scan 208, which includes projecting a controlled dispersion of laser beams (visible or invisible) onto one or more regions of a surface within a field of view of laser-scanning system 202. The scan 208 further includes detecting reflections of the laser beams from the surfaces to perform distance measurements. The distance measurements provide data for generating a three-dimensional profile of the one or more regions. In some implementations, a field of view of the scan 208 may be fixed (e.g., an angle corresponding to the field of view may be fixed). In other implementations, the field of view of the scan 208 may be adjustable (e.g., an angle corresponding to the field of view may be adjustable).

An example of the laser-scanning system 202 includes a line laser that produces multiple lines of lasers (e.g., a mesh of laser beams) to scan one or more regions of a surface. Alternatively, the laser-scanning system 202 may include a line laser that produces a single line (e.g., a single laser beam) that is traversed (or swept) across the one or more regions of the surface, among other examples. In some implementations, the one or more regions of the surface correspond to a portion of a vessel or a layer within a vessel (e.g., a portion of the vessel layer within the vessel 112). A "layer," as used herein, refers to a circumferential portion of the surface of a vessel (e.g., the vessel 112) that has a height that is less than the full height of the vessel between the collector and the top of the IF cap. Thus, if the laser-scanning system 202 scans a vessel in layers, the laser-scanning system 202 scans at least two layers of the vessel. Furthermore, scanning the one or more regions of the surface may include scanning the one or more regions of the surface for an amount of an accumulation of a target material (e.g., an amount of an accumulation of the droplets 118 on an interior surface of the vessel 112).

Components of the motor system 204 include at least a rotational motor subsystem 210 and a linear motor subsystem 212. The rotational motor subsystem 210 may include one or more components for a rotational movement 214 of the laser-scanning system 202 about an axis 216 of the elongated support member 206a. The linear motor subsystem 212 may include one or more components for a linear movement 218 of the laser-scanning system 202 along the axis 216 of the elongated support member 206a.

Components of the rotational motor subsystem 210 may include a stepper motor, a servo motor, a radial bearing, and/or a gear system, among other examples. The rotational motor subsystem 210 may be configured to perform the rotational movement 214 in increments that are included in a range from approximately 0.03 degrees (°) to approximately 0.07°. Furthermore, the rotational motor subsystem 210 may be configured to perform the rotation at a rotational rate that is included in a range from approximately 5 rotations per minute (RPM) to approximately 7 RPM. By selecting increments and rotational rates within these example ranges, the laser-scanning system 202 may perform a radial scan (e.g., multiples of the scan 208 at different radial positions) at a resolution that provides sufficient data to determine a profile of a radial surface. Other values and ranges for the rotational increments and rotational rates are within scope of this disclosure.

Components of the linear motor subsystem 212 may include a stepper motor, a servo motor, a linear bearing, a belt drive, a leadscrew, and/or a linear-induction motor, among other examples. The linear motor subsystem 212 is configured to perform the linear movement 218 in increments that are included in a range from approximately 0.5 millimeters to approximately 1.5 millimeters. By selecting increments within this range, the linear motor subsystem 212 may position the laser-scanning system 202 at different respective locations relative to a surface that are sufficient to determine profiles of different portions of a vessel. Other values and ranges for increments associated with the linear movement 218 are within scope of this disclosure.

As indicated above, FIG. 2 is provided as an example. Other examples may differ from what is described with regard to FIG. 2 and may include additional components, fewer components, different components, or differently arranged components than those shown in FIG. 2. For example, and although illustrated and described as supported by the elongated support member 206a, in some implementations one or more components of the motor system 204 and the laser-scanning system 202 are separate from the elongated support member 206a (e.g., the linear motor subsystem 212 may include a stepper motor that is indirectly coupled to a leadscrew component that is integrated as part of the elongated support member 206a, among other examples). Additionally, or alternatively, a set of components (e.g., one or more components) of FIG. 2 may perform one or more functions described herein as being performed by another set of components.

Figure 3:
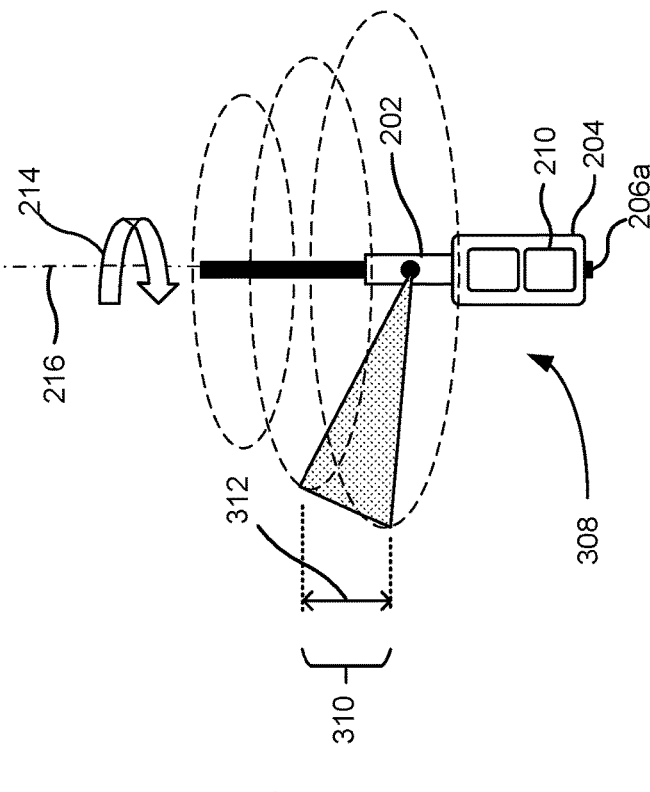
FIG. 3 is a diagram of an example implementation described herein.
Figure 3:
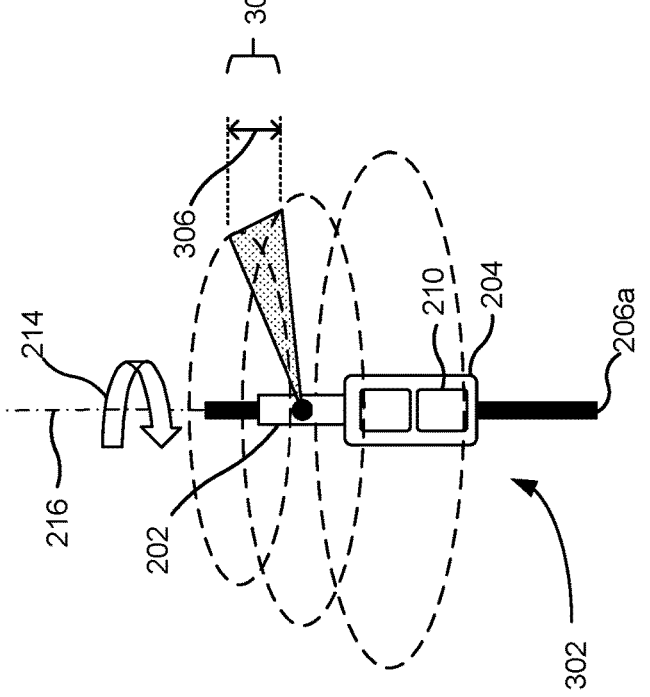

FIG. 3 is a diagram of an example implementation 300 described herein. The left example 302 of FIG. 3 includes an example of the laser-scanning system 202 in a linear position along the axis 216 of the elongated support member 206a. While in the linear position, the motor system 204 (e.g., the rotational motor subsystem 210) may receive a signal to cause the rotational movement 214 of the laser-scanning system 202 about the axis 216 to scan a layer 304 (e.g., a layer of an interior surface the vessel 112). For example, the controller 142 may transmit a signal to cause the motor system 204 to position the laser-scanning system 202 in the linear position (shown in the example 302 of FIG. 3) that is along the axis 216 of the elongated support member 206a, and may transmit a signal to cause the motor system 204 to rotate the laser-scanning system 202 about the axis 216 while the laser-scanning system 202 is in the linear position, and may transmit a signal to cause the laser-scanning system 202 to scan the layer 304 while the motor system 204 rotates the laser-scanning system 202 about the axis 216 in the linear position.

The layer 304 may correspond to at least a portion of a vessel. As an example, the layer 304 may have a height 306 that is included in a range from approximately 0.5 centimeters to approximately 5.5 centimeters. The height 306 may be appropriate for a layer corresponding to an intermediate focus (IF) cap portion of a vessel (e.g., the vessel 112), which may be susceptible to an accumulation of a target material and present a risk if such accumulation occurs (e.g., the IF cap portion may "spit" target material from the vessel 112 to cause contamination within the lithography system 100). Selecting the height 306 within such a range may achieve a desired coverage and scan speed for the IF cap portion of the vessel.

The right example 308 includes an example of the laser-scanning system 202 in another linear position (e.g., a lower linear position relative to the linear position of the example 302) along the axis of the elongated support member 206a. While in the other linear position, the motor system 204 (e.g., the rotational motor subsystem 210) may receive another signal to cause the rotational movement 214 of the laser-scanning system 202 about the axis 216 to scan a layer 310 (e.g., another layer of an interior surface the vessel 112). For example, the controller 142 may transmit a signal to cause the motor system 204 to position the laser-scanning system 202 in the other linear position (shown in the example 308 of FIG. 3) that is along the axis 216 of the elongated support member 206a, and may transmit a signal to cause the motor system 204 to rotate the laser-scanning system 202 about the axis 216 while the laser-scanning system 202 is in the other linear position, and may transmit a signal to cause the laser-scanning system 202 to scan the layer 310 while the motor system 204 rotates the laser-scanning system 202 about the axis 216 in the other linear position.

As an example, the layer 310 may have a height 312 that is included in a range from approximately 5.0 centimeters to approximately 21.0 centimeters. The height 312 may be appropriate for a layer corresponding to a lower cone portion of the vessel (e.g., the vessel 112), which may be less susceptible to an accumulation of a target material (e.g., less susceptible than the IF cap portion) and present a lower risk if such accumulation occurs. Selecting a height 312 within this range may achieve a desired coverage and scan speed of the lower cone portion of the vessel.

As yet another example, another layer corresponding to a vanes portion of the vessel (e.g., the vessel 112) may have a height that is in included in a range from approximately 20.0 centimeters to approximately 51.0 centimeters. Selecting a height within this range may achieve a desired coverage and scan time of the vanes portion of the vessel.

In general, values and ranges for layer heights may be combined, altered, or configured to achieve desired coverages and scan times of an entire interior surface of a vessel (e.g., an entire interior surface of the vessel 112).

As indicated above, FIG. 3 is provided as an example. Other examples may differ from what is described with regard to FIG. 3. Furthermore, other values and ranges for layer heights as described by FIG. 3 are within the scope of this disclosure.

Figure 4:
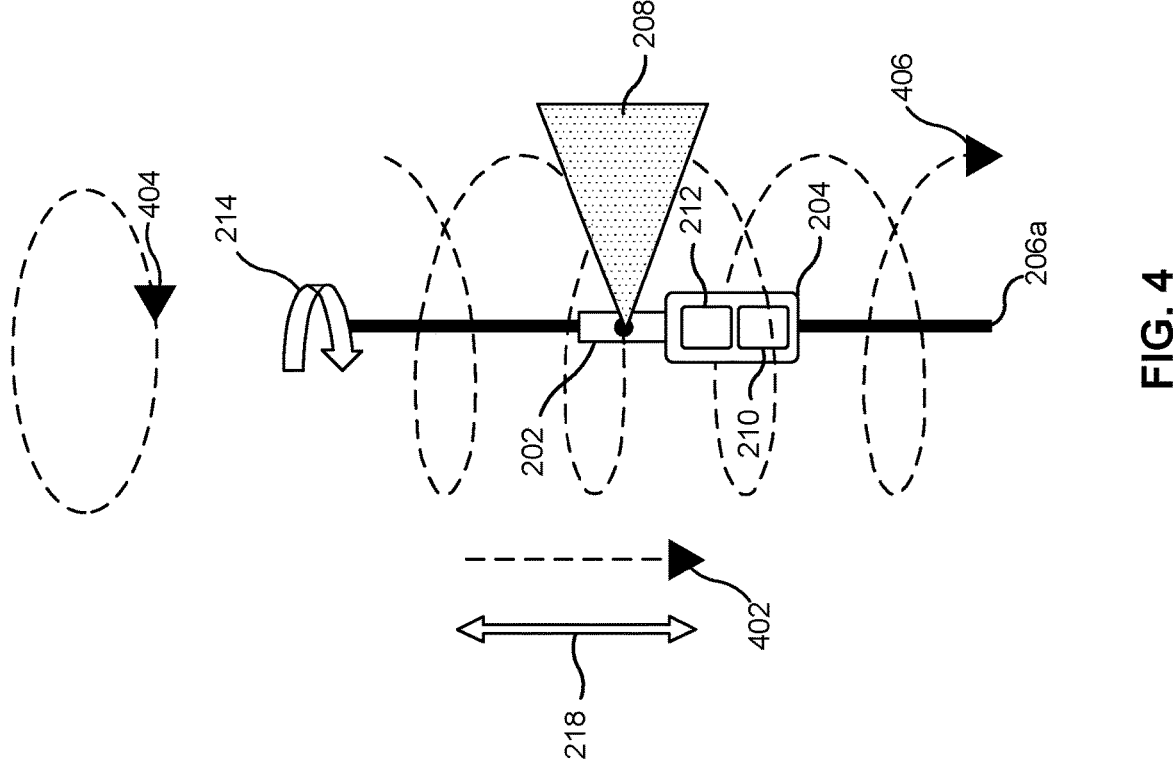
FIG. 4 is a diagram of an example implementation described herein.

FIG. 4 is a diagram of an example implementation 400 described herein. As shown in FIG. 4, the motor system 204 (including the rotational motor subsystem 210 and/or the linear motor subsystem 212) may provide the rotational movement 214 and/or the linear movement 218 to the laser-scanning system 202 to perform the scan 208 along one or more paths.

In some implementations, a combination of the rotational movement 214 and/or the linear movement 218 adjusts one or more positions (e.g., rotational and/or linear positions) of the laser-scanning system 202 along one or more paths while performing the scan 208. For example, the motor system 204 may adjust one or more positions of the laser-scanning system 202 along an approximately linear path 402 and along an approximately radial path 404. In some implementations, the motor system 204 adjusts the one or more positions simultaneously (or in synchronization) to cause the laser-scanning system 202 to traverse along an approximately helical path 406. In general, many paths and/or combinations of paths of the laser-scanning system 202, as provided by the motor system 204, are within scope of the present disclosure.

As indicated above, FIG. 4 is provided as an example. Other examples may differ from what is described with regard to FIG. 4.

Figure 5:
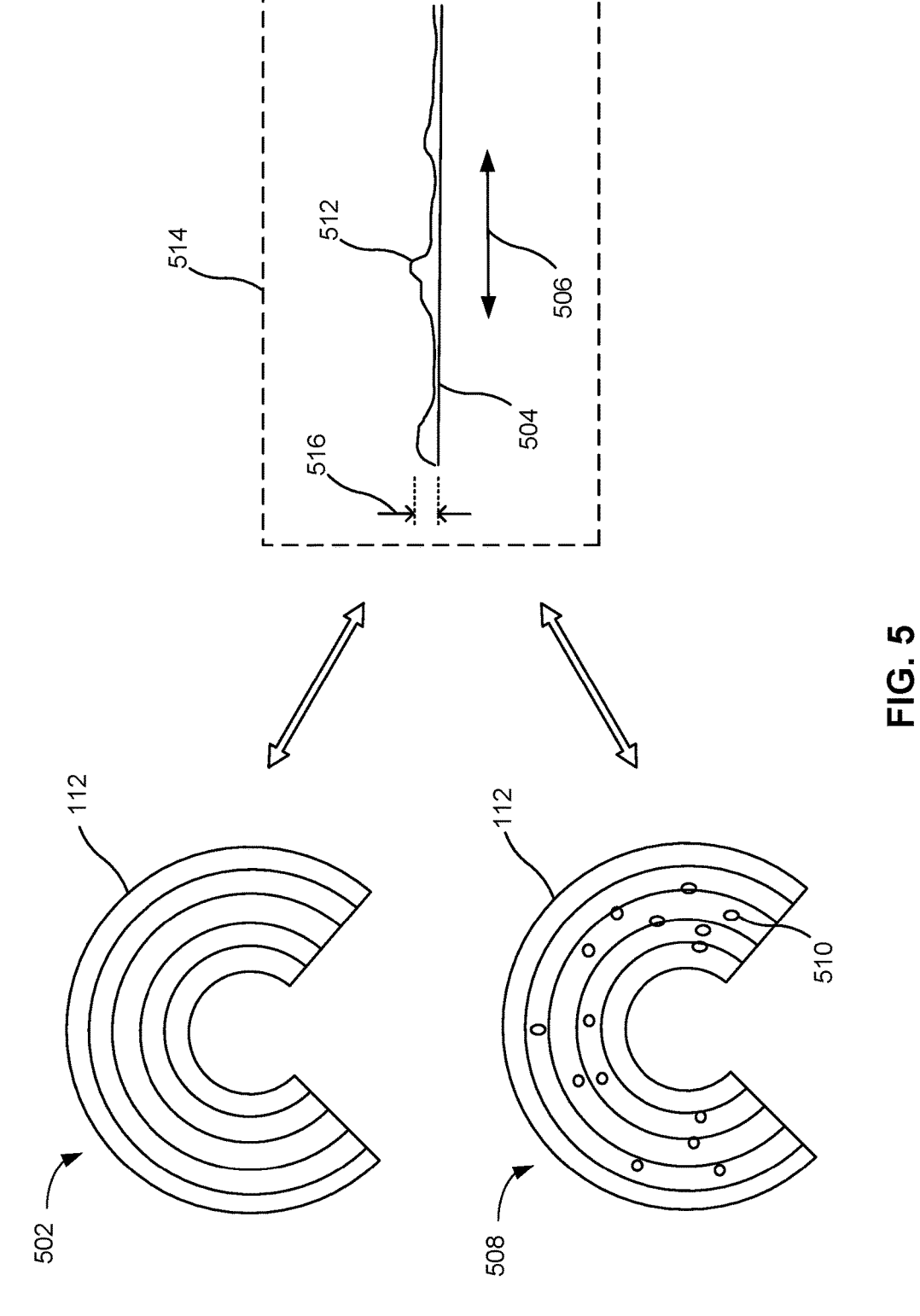
FIG. 5 is a diagram of example profiles of an interior surface of an example vessel described herein.

FIG. 5 is a diagram 500 of example profiles of an interior surface of the example vessel 112 described herein. The example profiles may be generated by a controller (e.g., the controller 142) based on information relating to one or more scans (e.g., one or more of the scans 208) provided to the controller by a laser-scanning system of an inspection tool (e.g., the laser-scanning system 202 of the inspection tool 140).

The upper-left example 502 of FIG. 5 includes an interior surface of the vessel 112 that is free from an accumulation of a target material (e.g., free from a buildup of material from the droplets 118 of FIG. 1). In this example, the interior surface of the vessel 112 may have a reference profile 504 across locations 506 of the interior surface. The reference profile 504 (which may also be referred to as a baseline profile or a "golden" profile) is indicative of the interior surface of the vessel 112 in a clean state, which may be prior to a first use of the vessel 112 or after a cleaning of the vessel 112.

The lower-left example 508 of FIG. 5 includes an interior surface of the vessel 112 on which an accumulation of a target material 510 has occurred (e.g., a buildup of the droplets 118 of FIG. 1 has occurred on the interior surface of the vessel 112). In this example, the interior surface of the vessel 112 may have a measured profile 512 across locations 506 of the interior surface. The measured profile 512 is indicative of an accumulation (e.g., dimensions in millimeters, as measured by the laser-scanning system 202) across the locations 506 of an interior surface of a vessel (e.g., the vessel 112).

In some implementations, the reference profile 504 may be subtracted from the measured profile 512 (e.g., the controller 142 may subtract information related to the reference profile 504 from information related to the measured profile 512) to generate a three-dimensional profile 514 and determine an amount of an accumulation 516 of the target material 510. The amount of the accumulation 516 may correspond to an average thickness of the target material (e.g., in millimeters), a mass of the target material (in grams), and/or a distribution or standard deviation of the target material (in millimeters or grams), among other examples.

In some implementations, the three-dimensional profile 514 is provided for storage in a memory device, for use by a computing system, and/or as input to a machine-learning algorithm. In such implementations, the three-dimensional profile 514 may be used for additional computations or assessments directed to preventive maintenance of the vessel 112, operation of a radiation source including the vessel 112 (e.g., the radiation source 102), or manufacturing control of a lithography system including the radiation source and the vessel 112 (e.g., the lithography system 100), among other examples. In some implementations, such additional computations or assessments may be performed by a controller (e.g., the controller 142), the radiation source (e.g., the radiation source 102), or the lithography system (e.g., the lithography system 100).

As indicated above, FIG. 5 is provided as an example. Other examples may differ from what is described with regard to FIG. 5.

Figure 6:
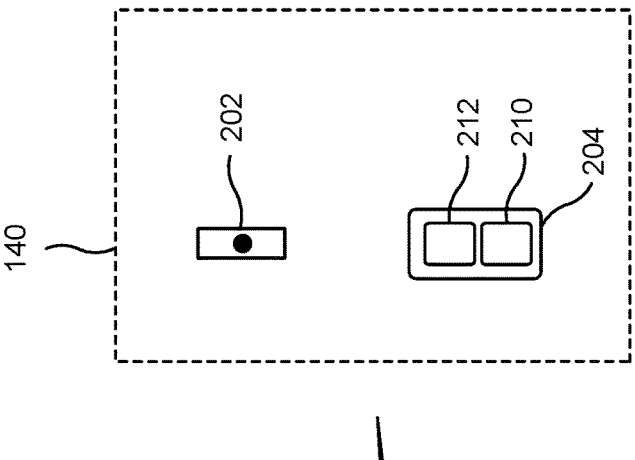
FIG. 6 is a diagram of an example controller that controls an example inspection tool described herein.
Figure 6:
Figure 6:
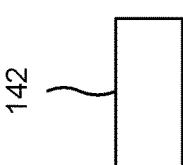
Figure 6:

FIG. 6 is a diagram of an example implementation 600 of the controller 142 that controls the example inspection tool 140 described herein. As shown in FIG. 6, components of the inspection tool 140 include the laser-scanning system 202 and the motor system 204 (including the rotational motor subsystem 210 and the linear motor subsystem 212). The inspection tool 140 may include a plurality of the components to inspect the interior surface of a vessel (e.g., the vessel 112) for an accumulation of a target material (e.g., the amount of the accumulation 516 of the target material 510). In some implementations, the inspection tool 140 includes a subset of the components shown in FIG. 6. In some implementations, the inspection tool 140 includes at least one of the components shown in FIG. 6.

The controller 142, may transmit signals to and/or receive signals from one or more of the plurality of components of the inspection tool 140 using one or more communication links 602 (e.g., one or more wireless-communication links, one or more wired-communication links, or a combination of a wireless-communication link and a wired-communication link). The signals may include individual signals, combinations or sequences of signals, analog signals, digital signals, digital communications, and/or other types of signals.

In some implementations, the signals cause the inspection tool 140 to generate scans of one or more portions of an interior surface of the vessel. The one or more portions may correspond to an IF cap portion, a lower cone portion, a scrubber portion, or a vanes portion of the vessel, among other examples. The one or more portions may also correspond to an entire portion of the interior surface of the vessel or a subset of the IF cap portion, the lower cone portion, the scrubber portion, or the vanes portion.

To generate the scans, the signals may include signals from the controller 142 to the laser-scanning system 202 that activate the laser-scanning system 202. The signals may further include signals from the laser-scanning system 202 to the controller 142 that include information relating to the scans.

As part of generating the scans, the controller 142 may transmit signals to the motor system 204 (including the linear motor subsystem 212 and/or the rotational motor subsystem 210) to adjust one or more positions of the laser-scanning system 202 along one or more paths relative to an elongated support member of a frame (e.g., the elongated support member 206a). The signals may cause the motor system 204 to adjust the position of the laser-scanning system 202 along a linear path (e.g., the approximately linear path 402), a radial path (e.g., the approximately radial path 404), or a helical path (e.g., the approximately helical path 406), among other examples.

In some implementations, the controller 142 uses one or more algorithms to determine an amount of an accumulation of a target material (e.g., the amount of the accumulation 516 of the target material 510) on a scanned portion of the interior surface of the vessel. Determining the amount of the accumulation may include generating a profile (e.g., the three-dimensional profile 514) based on information received from the laser-scanning system 202 (e.g., information relating to the scans, information relating to the measured profile 512, among other examples) as well as other information (e.g., information relating to the reference profile 504, among other examples). Generating the profile may further include stitching together respective profiles of different scanned layers (e.g., the layer 304 and/or the layer 310, among other examples).

The controller 142 may further determine that the amount of accumulation of the target material does not satisfy a threshold and, based on such a determination, transmit a signal to cause the inspection tool 140 to output a notification that the interior surface of the vessel 112 needs cleaning. Such a notification may be visual (e.g., correspond to a status indicator light) or audible (e.g., correspond to a warning sound or buzzer), among other examples.

The controller 142 may use a machine learning-model to determine a correlation between the amount of the accumulation of the target material and one or more operating conditions of a radiation source (e.g., the radiation source 102). For example, the machine-learning model may correlate historical target material (e.g., Sn) accumulation rates with historical operating conditions and/or historical operation parameters of the radiation source (e.g., a measured reflectivity of the radiation source, one or more parameters of an exposure operation performed by the radiation source, or a measured power decay of the radiation source, among other examples).

The controller 142 may provide information relating to the correlation to update a machine-learning model that estimates target material accumulation rates within the vessel for different recipes used by a lithography system (e.g., the lithography system 100) including the radiation source to manufacture semiconductor products. The controller 142 may further provide, to the machine-learning model, a projection of semiconductor products scheduled to be manufactured by the lithography system using one or more of the different recipes and estimate, using the machine learning model, a maintenance schedule relating to cleaning of vessel.

For a combination of operating conditions and/or parameters, the machine-learning model may have been trained to estimate one or more maintenance schedules for the vessel. The machine-learning model may estimate probabilities (e.g., risk scores) for accumulating the target material within the interior surface of the vessel based on a cleaning status of the vessel, operating conditions associated with a production schedule, and so on. Thus, the machine-learning model may be updated, and improved, based on information received from the controller 142.

As indicated above, FIG. 6 is provided as an example. Other examples may differ from what is described with regard to FIG. 6.

FIGS. 7A-7E are diagrams of an example implementation 700 described herein. The example implementation 700 includes one or more examples of using the inspection tool 140 to generate scans of portions of the interior surface of the vessel 112. FIGS. 7A-7E show one or more operations using the inspection tool 140 to inspect the vessel 112 for an amount of an accumulation of a target material (e.g., the amount of the accumulation 516 of the target material 510). The one or more operations may be performed in accordance with a maintenance schedule or in response to a detected degradation in performance of a radiation source having the vessel 112 (e.g., the radiation source 102), among other examples. In some implementations, the one or more operations of FIGS. 7A-7E may be performed in a photolithography bay of a semiconductor manufacturing facility or in a maintenance bay within the semiconductor manufacturing facility, among other examples.

Figure 7A:
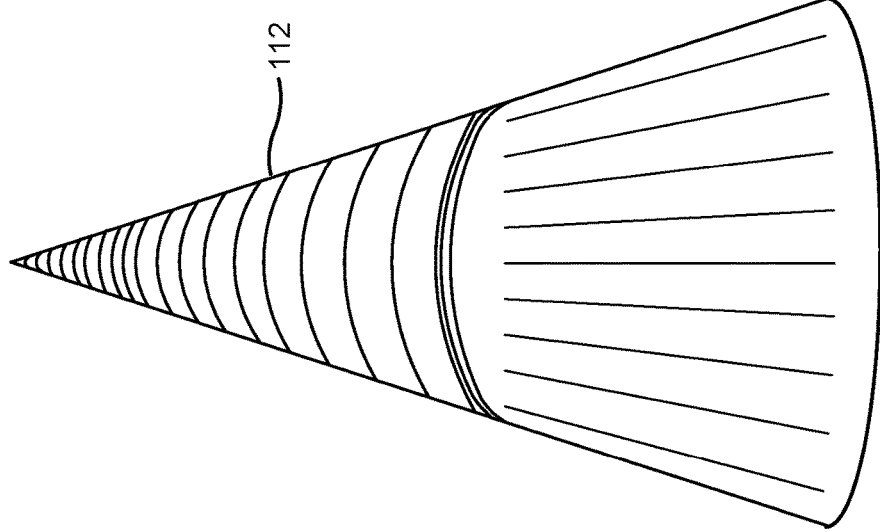
FIGS. 7A-7E are diagrams of an example implementation described herein.
Figure 7A:
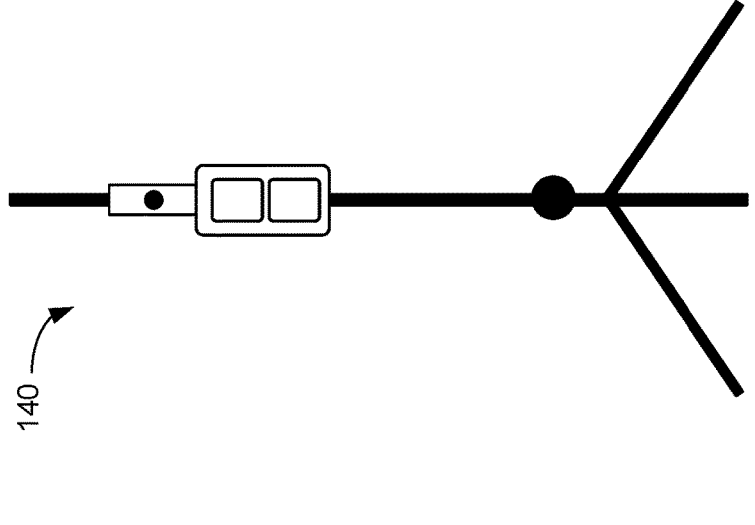

Turning to FIG. 7A, the inspection tool 140 is external to the vessel 112. For example, the inspection tool 140 may be set on a workbench or a floor and adjacent to a photolithography system including a radiation source having the vessel 112 (e.g., the photolithography system 100 including the radiation source 102 having the vessel 112). As another example, the inspection tool 140 may be part of an automated or semi-automated platform that interfaces with the photolithography system. Such an automated or semi-automated platform may be desirable to reduce a risk of damage to the vessel 112 while inspecting the vessel 112 for the amount of the accumulation of the target material.

Figure 7B:
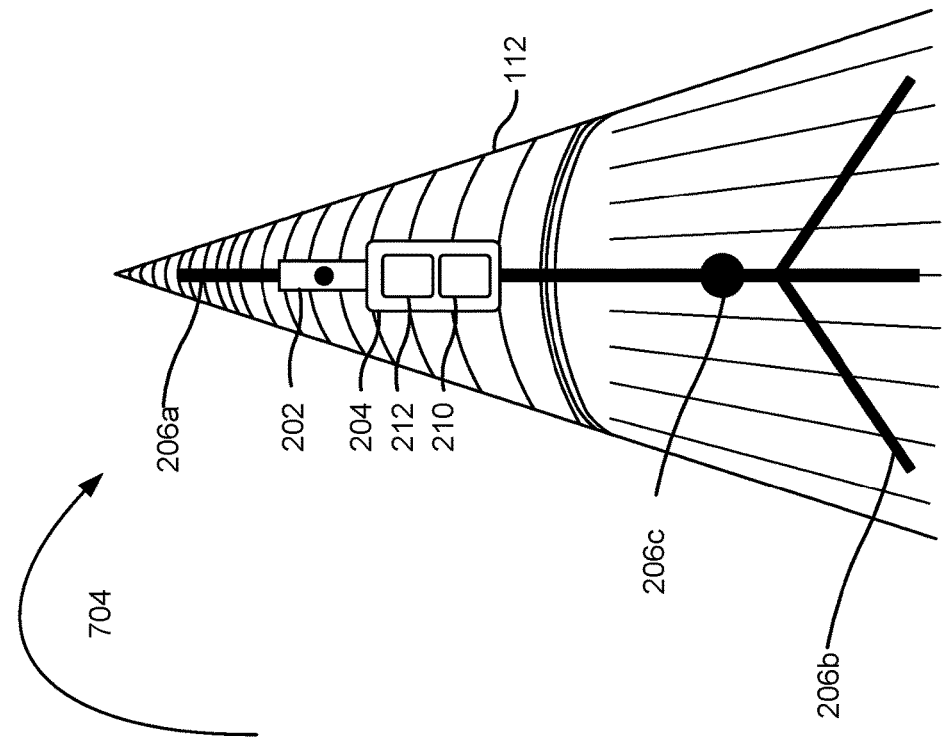
Figure 7B:
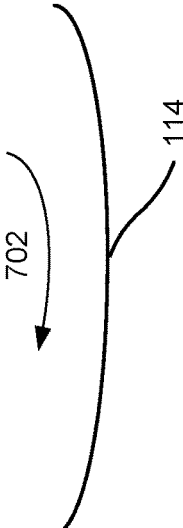

Turning to FIG. 7B, and as part of an operation 702, the collector 114 is removed from the vessel 112. In some implementations, a maintenance engineer may manually remove the collector 114 from the vessel 112. In some implementations, a robot (e.g., a robot that is part of the automated or semi-automated platform) may remove the collector 114 from the vessel 112.

As shown in FIG. 7B, and as part of an operation 704, at least a portion of an elongated support member 206a (e.g., a portion supporting the laser-scanning system 202 and the motor system 204, including the rotational motor subsystem 210 and the linear motor subsystem 212) is inserted into the vessel 112. In some implementations, the maintenance engineer may manually insert the portion of the elongated support member 206a into the vessel 112. In some implementations, the robot (e.g., the robot that is part of the automated or semi-automated platform) may insert the portion of the elongated support member 206a into the vessel 112. In some implementations, and as opposed to inserting the elongated support member 206a into the vessel 112, the maintenance engineer (or the robot) may lower the vessel 112 over the portion of the elongated support member 206a (e.g., the vessel 112 may have been removed from the radiation source 102 of the lithography system 100 and transported to the service bay for maintenance).

In some implementations, the maintenance engineer (or the robot) may adjust the alignment component 206c to change an orientation of the elongated support member 206a with respect to the base 206b and/or the vessel 112 (e.g. symmetrically position the elongated support member 206a within the vessel 112 or change an angle of the elongated support member 206a within the vessel 112, among other examples).

Figure 7C:
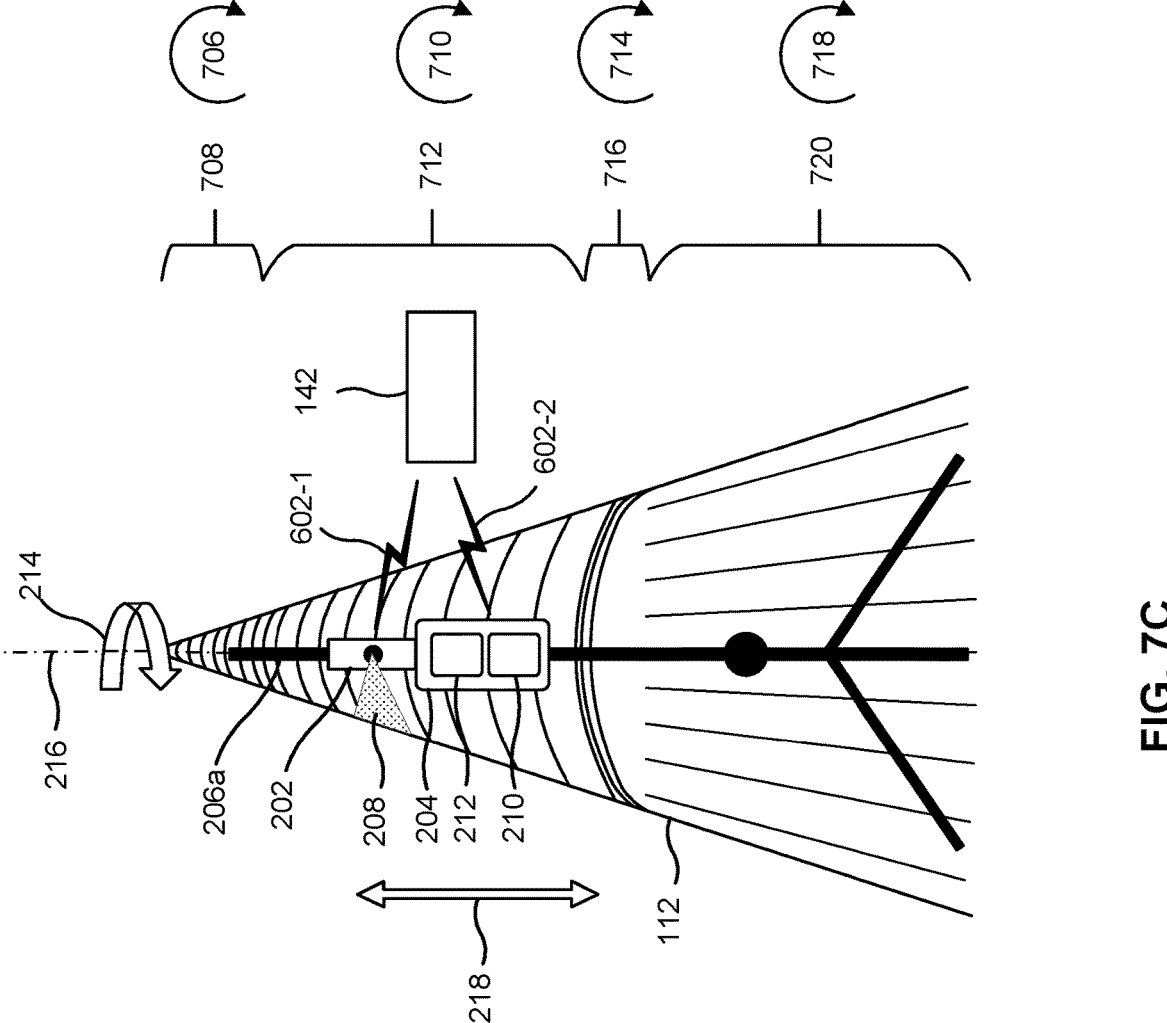

FIG. 7C shows multiple operations to scan one or more portions of an interior surface of the vessel 112. In some implementations, and to scan the one or more portions, the controller 142 communicates with the laser-scanning system 202 using the communication link 602-1 and communicates with the motor system 204 (including the rotational motor subsystem 210 and the linear motor subsystem 212) using the communication link 602-2. In general, the communication links 602-1 and 602-2 may transmit or receive one or more respective signals that include commands or information relevant to the scan 208 (e.g., a command to initiate the scan 208, a command to change a position of the laser-scanning system 202, and/or data indicative of a profile measurement made by the scan 208, among other examples).

As an example, and as part of an operation 706, the signals may activate the laser-scanning system 202 and cause the motor system 204 to perform one or more movements (e.g., combinations of the rotational movement 214 and the linear movement 218) with respect to the axis 216. The operation 706 may include the laser-scanning system 202 performing the scan 208 to scan portions (e.g., one or more layers) corresponding to an IF cap portion 708 of the vessel 112.

As another example, and as part of an operation 710, the signals may activate the laser-scanning system 202 and cause the motor system 204 to perform one or more movements (e.g., combinations of the rotational movement 214 and the linear movement 218) with respect to the axis 216. The operation 710 may include the laser-scanning system 202 performing the scan 208 to scan portions (e.g., one or more layers) corresponding to a lower cone portion 712 of the vessel 112.

As another example, and as part of an operation 714, the signals may activate the laser-scanning system 202 and cause the motor system 204 to perform one or more movements (e.g., combinations of the rotational movement 214 and the linear movement 218) with respect to the axis 216. The operation 714 may include the laser-scanning system 202 performing the scan 208 to scan portions (e.g., one or more layers) corresponding to a scrubber portion 716 of the vessel 112.

As another example, and as part of an operation 718, the signals may activate the laser-scanning system 202 and cause the motor system 204 to perform one or more movements (e.g., combinations of the rotational movement 214 and the linear movement 218) with respect to the axis 216. The operation 718 may include the laser-scanning system 202 performing the scan 208 to portions (e.g., one or more layers) corresponding to a vanes portion 720 of the vessel 112.

In some implementations, the controller 142 causes the inspection tool 140 to scan layers of the vessel 112 in a particular order. For example, the controller 142 may transmit signals to the inspection tool 140 (or one or more components thereof) to cause the inspection tool 140 in a direction from the collector 114 to the IF cap of the vessel 112 (e.g., from operation 718 to operation 706). As another example, the controller 142 may transmit signals to the inspection tool 140 (or one or more components thereof) to cause the inspection tool 140 in a direction from the IF cap of the vessel 112 to the collector (e.g., from operation 706 to operation 718).

Figure 7D:
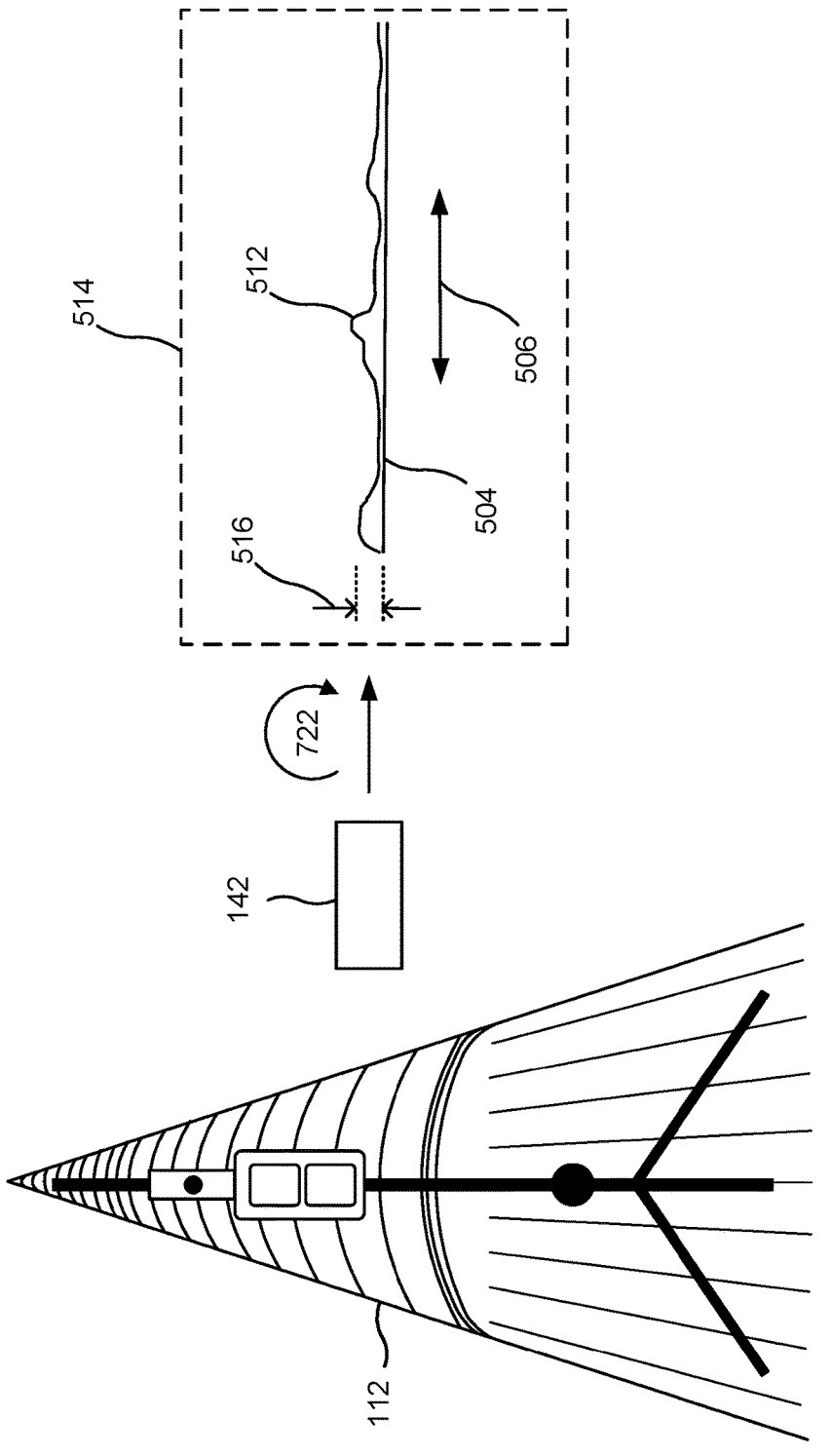

Turning to FIG. 7D, an operation 722 includes the controller 142 generating the three-dimensional profile 514 of the interior surface of the vessel 112. The controller 142 may generate the three-dimensional profile 514 using one or more techniques. For example, and as part of the one or more techniques, the controller 142 may subtract the reference profile 504 from the measured profile 512. The controller 142 may, as another example, use one or more algorithms to stitch together profiles of overlapping layers (e.g., the layer 304, the layer 310, among other examples) such that the three-dimensional profile 514 corresponds to an entire portion of the interior surface of the vessel 112. Generating the three-dimensional profile 514 may further include determining the amount of the accumulation 516 of a target material (e.g., the target material 510) on the interior surface of the vessel 112.

In some implementations, the operation 722 further includes providing the three-dimensional profile 514 to a machine-learning model to update the machine learning-model, providing the profile for storage in a maintenance memory device, and so on, among other examples.

Figure 7E:
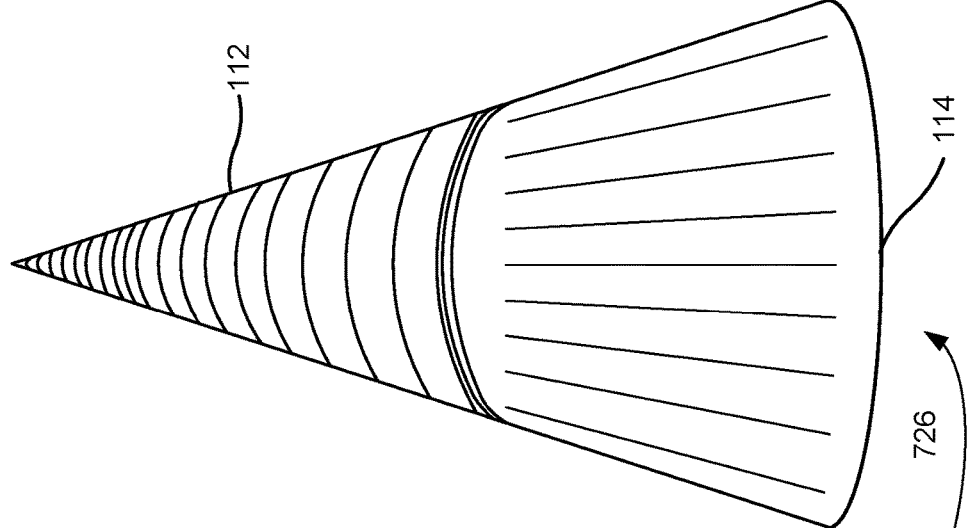
Figure 7E:
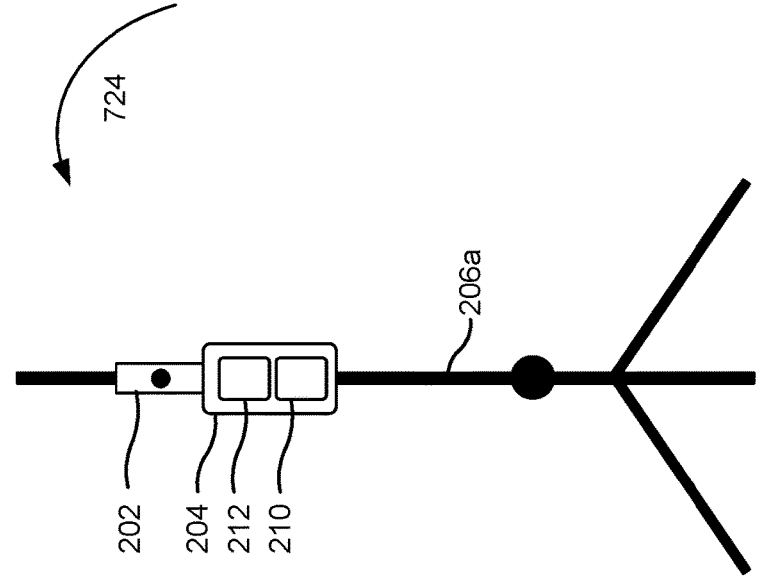

As shown in FIG. 7E, and as part of an operation 724, the portion of the elongated support member 206a is removed from the vessel 112. In some implementations, the maintenance engineer may manually remove the portion of the elongated support member 206a from the vessel 112. In other implementations, the robot (e.g., the robot that is part of the automated or semi-automated platform) may remove the elongated support member 206a from the vessel 112.

As part of an operation 726, the collector 114 is reattached to the vessel 112. In some implementations, the maintenance engineer may manually reattach the collector 114 to the vessel 112. In other implementations, the robot (e.g., the robot that is part of the automated or semi-automated platform) may reattach the collector 114 to the vessel 112.

As indicated above, FIGS. 7A-7E are provided as one or more examples. Other examples may differ from what is described with regard to FIGS. 7A-7E.

Figure 8:
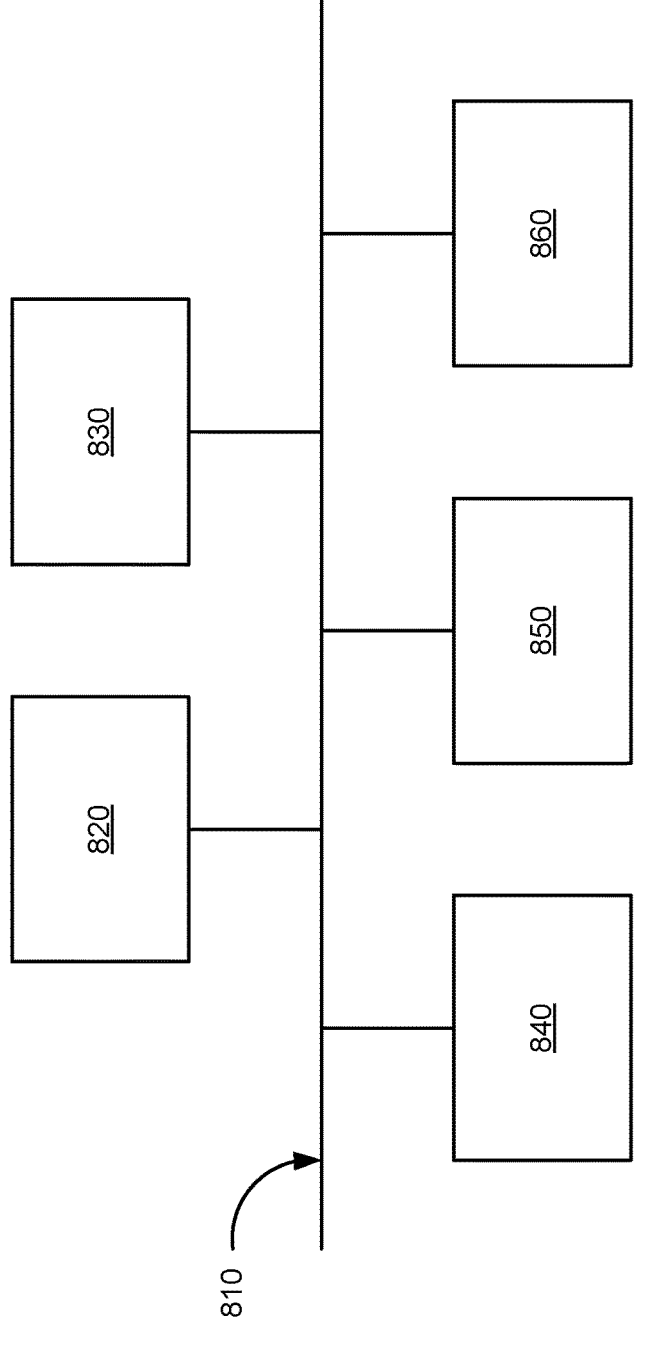
FIG. 8 is a diagram of example components of one or more devices of FIG. 1 described herein.

FIG. 8 is a diagram of example components of a device 800, which may correspond to the inspection tool 140, the controller 142, the laser-scanning system 202, and/or the motor system 204 (including the linear motor subsystem 212 and/or the rotational motor subsystem 210). In some implementations, the inspection tool 140, the controller 142, the laser-scanning system 202, and/or the motor system 204 (including the linear motor subsystem 212 and/or the rotational motor subsystem 210) may include one or more devices 800 and/or one or more components of device 800. As shown in FIG. 8, device 800 may include a bus 810, a processor 820, a memory 830, an input component 840, an output component 850, and a communication component 860.

Bus 810 includes one or more components that enable wired and/or wireless communication among the components of device 800. Bus 810 may couple together two or more components of FIG. 8, such as via operative coupling, communicative coupling, electronic coupling, and/or electric coupling. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform one or more operations or processes described elsewhere herein.

Memory 830 includes volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory 830 may be a non-transitory computer-readable medium. Memory 830 stores information, instructions, and/or software (e.g., one or more software applications) related to the operation of device 800. In some implementations, memory 830 includes one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

FIG. 9 is a flowchart of an example process 900 relating to inspection of a vessel described herein. In some implementations, one or more process blocks of FIG. 9 may be performed by a controller (e.g., controller 142, the device 800). In some implementations, one or more process blocks of FIG. 9 may be performed by another device or a group of devices separate from or including the controller 142, such as the inspection tool 140, the laser-scanning system 202, and/or the motor system 204 (including the linear motor subsystem 212 and/or the rotational motor subsystem 210).

Additionally, or alternatively, one or more process blocks of FIG. 9 may be performed by one or more components of device 800, such as processor 820, memory 830, input component 840, output component 850, and/or communication component 860.

As shown in FIG. 9, process 900 may include transmitting, to a motor system, a first signal to cause the motor system to position a laser-scanning system in a first linear position that is along an axis of a frame located within a vessel of an EUV radiation source (block 910). For example, the controller 142 may transmit, to a motor system 204, a first signal to cause the motor system 204 to position a laser-scanning system 202 in a first linear position that is in an axis 216 of a frame located within a vessel 112 of an EUV radiation source (e.g., the radiation source 102). In some implementations, the motor system 204, the laser-scanning system 202, and the frame are included in an inspection tool 140.

As further shown in FIG. 9, process 900 may include transmitting, to the motor system, a second signal to cause the motor system to rotate the laser-scanning system about the axis 216 while the laser-scanning system is in the first linear position (block 920). For example, the controller 142 may transmit, to the motor system 204, a second signal to cause the motor system 204 to rotate the laser-scanning system 202 about the axis 216 while the laser-scanning system 202 is in the first linear position, as described above.

As further shown in FIG. 9, process 900 may include transmitting, to the laser-scanning system, a third signal to cause the laser-scanning system to scan a first layer of an interior surface of the vessel (block 930). For example, the controller 142 may transmit, to the laser-scanning system 202, a third signal to cause the laser-scanning system 202 to scan a first layer 304 of an interior surface of the vessel 112. In some implementations, the laser-scanning system 202 scans the first layer 304 while the motor system 204 rotates the laser-scanning system 202 about the axis 216 in the first linear position.

As further shown in FIG. 9, process 900 may include transmitting, to the motor system, a fourth signal to cause the motor system to linearly move the laser-scanning system along the axis of the frame to a second linear position along the axis after the laser-scanning system scans the first layer (block 940). For example, the controller 142 may transmit, to the motor system 204, a fourth signal to cause the motor system 204 to linearly move the laser-scanning system 202 along the axis 216 of the frame to a second linear position in the axis 216 after the laser-scanning system 202 scans the first layer 304, as described above.

As further shown in FIG. 9, process 900 may include transmitting, to the motor system, a fifth signal to cause the motor system to rotate the laser-scanning system about the axis while the laser-scanning system is in the second linear position (block 950). For example, the controller 142 may transmit, to the motor system 204, a fifth signal to cause the motor system 204 to rotate the laser-scanning system 202 about the axis 216 while the laser-scanning system 202 is in the second linear position, as described above.

As further shown in FIG. 9, process 900 may include transmitting, to the laser-scanning system, a sixth signal to cause the laser-scanning system to scan a second layer of the interior surface of the vessel (block 960). For example, the controller 142 may transmit, to the laser-scanning system 202, a sixth signal to cause the laser-scanning system 202 to scan a second layer 310 of the interior surface of the vessel 112. In some implementations, the laser-scanning system

202 scans the second layer 310 while the motor system 204 rotates the laser-scanning system 202 about the axis 216 in the second linear position.

Process 900 may include additional implementations, such as any single implementation or any combination of implementations described below and/or in connection with one or more other processes described elsewhere herein.

In a first implementation, a height 306 of the first layer 304 of the interior surface of the vessel 112 is in a range from approximately 0.5 centimeters to approximately 5.5 centimeters.

In a second implementation, alone or in combination with the first implementation, a height 312 of the second layer 310 of the interior surface of the vessel 112 is in a range from approximately 5.0 centimeters to approximately 21.0 centimeters.

In a third implementation, alone or in combination with one or more of the first and second implementations, scanning the first layer 304 corresponds to scanning an intermediate focus (IF) cap portion 708 of the vessel 112.

In a fourth implementation, alone or in combination with one or more of the first through third implementations, scanning the second layer 310 corresponds to scanning a lower cone portion 712 of the vessel, a scrubber portion 716 of the vessel 112, or a vanes portion 720 of the vessel 112.

In a fifth implementation, alone or in combination with one or more of the first through fourth implementations, process 900 includes receiving information associated with a measured profile of the interior surface, determining, based on the information, that an amount of an accumulation 516 of a target material 510 on the interior surface does not satisfy a threshold, and transmitting a signal to cause the inspection tool to output a notification that the interior surface needs cleaning.

In a sixth implementation, alone or in combination with one or more of the first through fifth implementations, the threshold corresponds to a threshold for the first layer of the interior surface.

In a seventh implementation, alone or in combination with one or more of the first through sixth implementations, the threshold corresponds to a threshold for the second layer of the interior surface.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

FIG. 10 is a flowchart of an example process 1000 related to inspection of a vessel described herein. In some implementations, one or more process blocks of FIG. 10 may be performed by a controller (e.g., the controller 142, the device 800). In some implementations, one or more process blocks of FIG. 10 may be performed by another device or a group of devices separate from or including the controller 142, such as the inspection tool 140, the laser-scanning system 202, and/or the motor system 204 (including the linear motor subsystem 212 and/or the rotational motor subsystem 210). Additionally, or alternatively, one or more process blocks of FIG. 10 may be performed by one or more components of device 800, such as processor 820, memory 830, input component 840, output component 850, and/or communication component 860.

As shown in FIG. 10, process 1000 may include receiving, from a laser-scanning system, first information corresponding to a measured profile of an interior surface of a vessel (block 1010). For example, the controller 142 may receive, from a laser-scanning system 202, first information corresponding to a measured profile 512 of an interior surface of a vessel 112, as described above.

As further shown in FIG. 10, process 1000 may include receiving, from the laser-scanning system, second information corresponding to a reference profile of the interior surface of the vessel (block 1020). For example, the controller 142 may receive, from the laser-scanning system 202, second information corresponding to a reference profile 504 of the interior surface of the vessel 112, as described above.

As further shown in FIG. 10, process 1000 may include generating a three-dimensional profile of the interior surface of the vessel (block 1030). For example, the controller 142 may generate a three-dimensional profile 514 of the interior surface of the vessel 112. In some implementations, generating the three-dimensional profile 514 is based on the first information and the second information.

As further shown in FIG. 10, process 1000 may include determining an amount of an accumulation of a target material based on the three-dimensional profile (block 1040). For example, the controller 142 may determine an amount of an accumulation 516 of a target material 510 based on the three-dimensional profile 514, as described above.

Process 1000 may include additional implementations, such as any single implementation or any combination of implementations described below and/or in connection with one or more other processes described elsewhere herein.

In a first implementation, the second information corresponding to the reference profile 504 corresponds to a golden profile of the interior surface of the vessel 112 that is indicative of a clean state of the interior surface of the vessel 112.

In a second implementation, alone or in combination with the first implementation, the target material 510 corresponds to a tin (Sn) material.

In a third implementation, alone or in combination with one or more of the first and second implementations, process 1000 includes determining a correlation between the amount of the accumulation of the target material 510 and at least one operating condition of an EUV radiation source 102 including the vessel 112, and providing information relating to the correlation to update a machine-learning model that estimates accumulations rates of a target material on the interior surface of the vessel 112 for different operating conditions of the EUV radiation source 102.

In a fourth implementation, alone or in combination with one or more of the first through third implementations, the at least one operating condition includes a measured reflectivity of the EUV radiation source 102, one or more parameters of an exposure operation performed by the EUV radiation source 102, or a measured power decay of the EUV radiation source 102.

In a fifth implementation, alone or in combination with one or more of the first through fourth implementations, process 1000 includes associating portions of the amount of the accumulation to respective portions of the vessel 112, and estimating, using a machine-learning model, a maintenance schedule relating to cleaning for each of the respective portions.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

FIG. 11 is a flowchart of an example process 1100 relating to inspection of a vessel described herein. In some implementations, one or more process blocks of FIG. 11 may be performed by a controller (e.g., controller 142, the device 800). In some implementations, one or more process blocks of FIG. 11 may be performed by another device or a group of devices separate from or including the controller 142, such as the inspection tool 140, the laser-scanning system 202, and/or the motor system 204 (including the linear motor subsystem 212 and/or the rotational motor subsystem 210). Additionally, or alternatively, one or more process blocks of FIG. 11 may be performed by one or more components of device 800, such as processor 820, memory 830, input component 840, output component 850, and/or communication component 860.

As shown in FIG. 11, process 1100 may include transmitting, to a motor system, a first signal to cause the motor system to rotate a laser-scanning system, while in a first linear position, about an axis of a frame located within a vessel of an extreme ultraviolet EUV radiation source (block 1110). For example, the controller 142 may transmit, to a motor system 204, a first signal to cause the motor system 204 to rotate a laser-scanning system 202, while in a first linear position, about an axis 216 of a frame located within a vessel 112 of an EUV radiation source (e.g., the radiation source 102), as described above. In some implementations, the motor system 204, the laser-scanning system 202, and the frame are included in an inspection tool 140. In some implementations, the laser-scanning system 202 scans a first layer of an interior surface of the vessel 112 while rotating about the axis 216 in the first linear position.

As further shown in FIG. 11, process 1100 may include transmitting, to the motor system, a second signal to cause the motor system to rotate the laser-scanning system about the axis while the laser-scanning system is in a second linear position (block 1120). For example, the controller 142 may transmit, to the motor system 204, a second signal to cause the motor system 204 to rotate the laser-scanning system 202 about the axis 216 while the laser-scanning system 202 is in a second linear position, as described above. In some implementations, the laser-scanning system 202 scans a second layer of the interior surface of the vessel 112 while rotating about the axis 216 in the second linear position.

Process 1100 may include additional implementations, such as any single implementation or any combination of implementations described below and/or in connection with one or more other processes described elsewhere herein.

In a first implementation, a height of the first layer of the interior surface of the vessel is in a range from approximately 0.5 centimeters to approximately 5.5 centimeters, and wherein a height of the second layer of the interior surface of the vessel is in a range from approximately 5.0 centimeters to approximately 21.0 centimeters. In a second implementation, alone or in combination with the first implementation, scanning the first layer corresponds to scanning an intermediate focus (IF) cap portion of the vessel, and wherein scanning the second layer corresponds to scanning a lower cone portion of the vessel, a scrubber portion of the vessel, or a vanes portion of the vessel. In a third implementation, alone or in combination with one or more of the first and second implementations, process 1100 includes receiving information associated with a measured profile of the interior surface, determining, based on the information, that an amount of an accumulation of a target material on the interior surface does not satisfy a threshold, and transmitting a signal to cause the inspection tool to output a notification that the interior surface needs cleaning.

In a fourth implementation, alone or in combination with one or more of the first through third implementations, the threshold corresponds to at least one of a threshold for the first layer of the interior surface, or a threshold for the second layer of the interior surface. In a fifth implementation, alone or in combination with one or more of the first through fourth implementations, process 1100 includes transmitting, by the controller and to the motor system, a third signal to cause the motor system to position the laser-scanning system in the first linear position that is along the axis of the frame located within the vessel, and transmitting, by the controller and to the motor system, a fourth signal to cause the motor system to position the laser-scanning system in the second linear position that is along the axis of the frame located within the vessel. In a sixth implementation, alone or in combination with one or more of the first through fifth implementations, process 1100 includes transmitting, by the controller and to the laser-scanning system, a third signal to cause the laser-scanning system to scan the first layer of an interior surface of the vessel, and transmitting, by the controller and to the laser-scanning system, a fourth signal to cause the laser-scanning system to scan the second layer of the interior surface of the vessel. In a seventh implementation, alone or in combination with one or more of the first through sixth implementations, the laser-scanning system scans the second layer after scanning the first layer.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

Some implementations described herein provide techniques and apparatuses for inspecting interior surfaces of a vessel of a radiation source for an accumulation of a target material. An inspection tool, including a laser-scanning system and a motor system supported by an elongated supported member, may be inserted into the vessel to generate an accurate three-dimensional profile of the interior surfaces. Use of the inspection tool is efficient, with short setup and scan times that substantially reduce a duration associated with evaluating the interior surfaces of the vessel for the accumulation. In this way, the inspection tool described herein may decrease downtime of the lithography system including the EUV vessel and may increase productivity and throughput of the lithography system.

As described in greater detail above, some implementations described herein provide a method. The method includes transmitting, by a controller and to a motor system, a first signal to cause the motor system to position a laser-scanning system in a first linear position that is in an axis of a frame located within a vessel of an EUV radiation source, where the motor system, the laser-scanning system, and the frame are included in an inspection tool. The method includes transmitting, by the controller and to the motor system, a second signal to cause the motor system to rotate the laser-scanning system about the axis while the laser-scanning system is in the first linear position. The method includes transmitting, by the controller and to the laser-scanning system, a third signal to cause the laser-scanning system to scan a first layer of an interior surface of the vessel, where the laser-scanning system scans the first layer while the motor system rotates the laser-scanning system about the axis in the first linear position. The method includes transmitting, by the controller and to the motor system, a fourth signal to cause the motor system to linearly move the laser-scanning system along the axis of the frame to a second linear position in the axis after the laser-scanning system scans the first layer. The method includes transmitting, by the controller and to the motor system, a fifth signal to cause the motor system to rotate the laser-scanning system about the axis while the laser-scanning system is in the second linear position. The method includes transmitting, by the controller and to the laser-scanning system, a sixth signal to cause the laser-scanning system to scan a second layer of the interior surface of the vessel, where the laser-scanning system scans the second layer while the motor system rotates the laser-scanning system about the axis in the second linear position.

As described in greater detail above, some implementations described herein provide a method. The method includes receiving, by a controller and from a laser-scanning system, first information corresponding to a measured profile of an interior surface of a vessel. The method includes receiving, by the controller and from the laser-scanning system, second information corresponding to a reference profile of the interior surface of the vessel. The method includes generating, by the controller, a three-dimensional profile of the interior surface of the vessel, where generating the three-dimensional profile is based on the first information and the second information. The method includes determining, by the controller, an amount of an accumulation of a target material based on the three-dimensional profile.

As described in greater detail above, some implementations described herein provide an inspection tool. The inspection tool includes a frame including an elongated support member, where the elongated support member is configured to be at least partially inserted into a vessel of an EUV radiation source. The inspection tool includes a laser-scanning system supported by the frame and configured, generate scans of a portion of an interior surface of the vessel transmit information relating to the scans to a controller. The inspection tool includes a motor system configured, adjust one or more positions of the laser-scanning system along one or more paths relative to the frame to generate the scans. The inspection tool includes the controller configured, receive, from the laser-scanning system, the information relating to the scans determine an accumulation of a target material on the portion of the interior surface based on the information relating to the scans.

As described in greater detail above, some implementations described herein provide a method. The method includes transmitting, by a controller and to a motor system, a first signal to cause the motor system to rotate a laser-scanning system, while in a first linear position, about an axis of a frame located within a vessel of an EUV radiation source. The motor system, the laser-scanning system, and the frame are included in an inspection tool. The laser-scanning system scans a first layer of an interior surface of the vessel while rotating about the axis in the first linear position. The method includes transmitting, by the controller and to the motor system, a second signal to cause the motor system to rotate the laser-scanning system about the axis while the laser-scanning system is in a second linear position. The laser-scanning system scans a second layer of the interior surface of the vessel while rotating about the axis in the second linear position.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

transmitting, by a controller and to a motor system, a first signal to cause the motor system to rotate a laser-scanning system, while in a first linear position, about an axis of a frame located within a vessel of an extreme ultraviolet (EUV) radiation source, wherein the motor system, the laser-scanning system, and the frame are included in an inspection tool, and wherein the laser-scanning system scans a first layer of an interior surface of the vessel while rotating about the axis in the first linear position; and transmitting, by the controller and to the motor system, a second signal to cause the motor system to rotate the laser-scanning system about the axis while the laser-scanning system is in a second linear position, wherein the laser-scanning system scans a second layer of the interior surface of the vessel while rotating about the axis in the second linear position.

2. The method of claim 1, wherein a height of the first layer of the interior surface of the vessel is in a range from approximately 0.5 centimeters to approximately 5.5 centimeters; and wherein a height of the second layer of the interior surface of the vessel is in a range from approximately 5.0 centimeters to approximately 21.0 centimeters.

3. The method of claim 1, wherein scanning the first layer corresponds to scanning an intermediate focus (IF) cap portion of the vessel; and wherein scanning the second layer corresponds to scanning a lower cone portion of the vessel, a scrubber portion of the vessel, or a vanes portion of the vessel.

4. The method of claim 1, further comprising:

receiving information associated with a measured profile of the interior surface;

determining, based on the information, that an amount of an accumulation of a target material on the interior surface does not satisfy a threshold; and transmitting a signal to cause the inspection tool to output a notification that the interior surface needs cleaning.

5. The method of claim 4, wherein the threshold corresponds to at least one of:

a threshold for the first layer of the interior surface, or a threshold for the second layer of the interior surface.

6. The method of claim 1, further comprising:

transmitting, by the controller and to the motor system, a third signal to cause the motor system to position the laser-scanning system in the first linear position that is along the axis of the frame located within the vessel; and transmitting, by the controller and to the motor system, a fourth signal to cause the motor system to position the laser-scanning system in the second linear position that is along the axis of the frame located within the vessel.

7. The method of claim 1, further comprising:

transmitting, by the controller and to the laser-scanning system, a third signal to cause the laser-scanning system to scan the first layer of an interior surface of the vessel; and transmitting, by the controller and to the laser-scanning system, a fourth signal to cause the laser-scanning system to scan the second layer of the interior surface of the vessel.

8. The method of claim 1, wherein the laser-scanning system scans the second layer after scanning the first layer.

9. A method, comprising:

receiving, by a controller and from a laser-scanning system, first information corresponding to a measured profile of an interior surface of a vessel;

receiving, by the controller and from the laser-scanning system, second information corresponding to a reference profile of the interior surface of the vessel;

generating, by the controller, a three-dimensional profile of the interior surface of the vessel, wherein generating the three-dimensional profile is based on the first information and the second information; and determining, by the controller, an amount of an accumulation of a target material based on the three-dimensional profile.

10. The method of claim 9, wherein the second information corresponding to the reference profile corresponds to a golden profile of the interior surface of the vessel that is indicative of a clean state of the interior surface of the vessel.

11. The method of claim 9, wherein the target material corresponds to a tin (Sn) material.

12. The method of claim 9, further comprising:

determining a correlation between the amount of the accumulation of the target material and at least one operating condition of an EUV radiation source including the vessel; and providing information relating to the correlation to update a machine-learning model that estimates accumulations rates of a target material on the interior surface of the vessel for different operating conditions of the EUV radiation source.

13. The method of claim 12, wherein the at least one operating condition includes a measured reflectivity of the EUV radiation source, one or more parameters of an exposure operation performed by the EUV radiation source, or a measured power decay of the EUV radiation source.

14. The method of claim 9, further comprising:

associating portions of the amount of the accumulation to respective portions of the vessel; and estimating, using a machine-learning model, a maintenance schedule relating to cleaning for each of the respective portions.

15. An inspection tool, comprising:

a frame including an elongated support member, wherein the elongated support member is configured to be at least partially inserted into a vessel of an extreme ultraviolet (EUV) radiation source;

a laser-scanning system supported by the frame and configured to:

generate scans of a portion of an interior surface of the vessel; and transmit information relating to the scans to a controller;

a motor system configured to:

adjust one or more positions of the laser-scanning system along one or more paths relative to the frame to generate the scans; and the controller configured to:

receive, from the laser-scanning system, the information relating to the scans; and determine an amount of an accumulation of a target material on the portion of the interior surface based on the information relating to the scans.

16. The inspection tool of claim 15, wherein the one or more paths include an approximately helical path.

17. The inspection tool of claim 15, wherein the one or more paths include an approximately linear path.

18. The inspection tool of claim 15, wherein the one or more paths include an approximately radial path.

19. The inspection tool of claim 15, wherein the portion of the interior surface of the vessel corresponds to an intermediate focus (IF) cap portion, a lower cone portion, a scrubber portion, or a vanes portion.

20. The inspection tool of claim 15, wherein the portion of the interior surface of the vessel corresponds to an entire portion.

* * * * *